United States Patent [19]
Shirasaki

[11] Patent Number: 5,592,500
[45] Date of Patent: Jan. 7, 1997

[54] LASER DEVICE

[75] Inventor: Masataka Shirasaki, Kawasaki, Japan

[73] Assignee: Fujitsu Limited, Kawasaki, Japan

[21] Appl. No.: 538,798

[22] Filed: Oct. 3, 1995

[30] Foreign Application Priority Data

Feb. 9, 1995 [JP] Japan .................. 7-022075

[51] Int. Cl.$^6$ .......................... H01S 3/10
[52] U.S. Cl. .............. 372/26; 372/32; 372/6; 372/92
[58] Field of Search ................ 372/6, 26, 94, 372/92, 29, 32

[56] References Cited

U.S. PATENT DOCUMENTS 5,064,288 11/1991 Dyes et al. .................. 372/94
5,276,701 1/1994 Shirasaki .................. 372/6
5,513,194 4/1996 Tamura et al. .................. 372/6

Primary Examiner—Leon Scott, Jr.
Attorney, Agent, or Firm—Staas & Halsey

[57] ABSTRACT

The present invention relates to a laser device. A laser resonator is formed of a positive dispersion region, a negative dispersion region, the first and second dispersion regions having the same dispersion amount, a first mode synchronous light modulator, a second mode synchronous light modulator, and a light gain medium. A light propagation path is formed by arranging in the light propagating order the first mode synchronous light modulator, the positive dispersion region, the second mode synchronous light modulator, and the negative dispersion region. The light gain medium is arranged in any place in the light transmission path. Control unit varies a relative phase in modulation between the first mode synchronous light modulator and the second mode synchronous light modulator. The simplified structure can suppress the device manufacturing cost and control the oscillation wavelength.

9 Claims, 4 Drawing Sheets

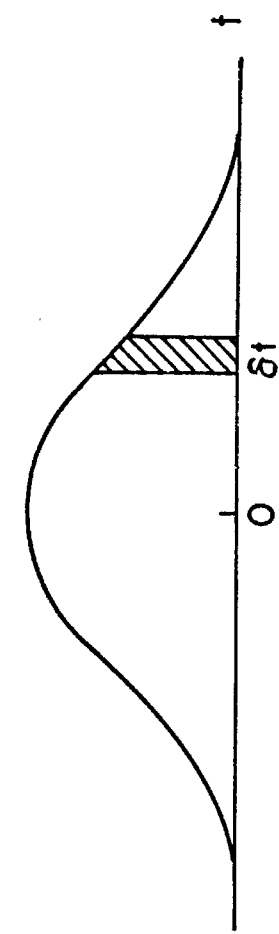
FIG. 3(a)  LIGHT GAIN MEDIUM 5
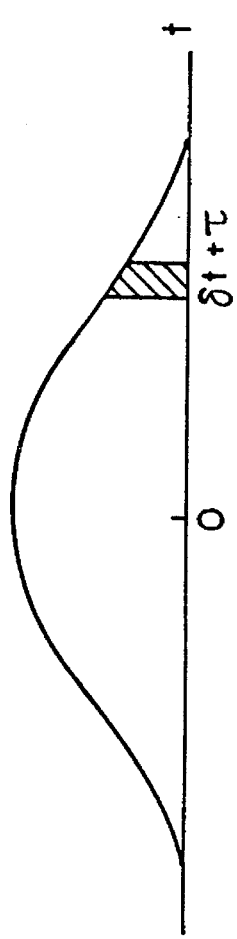
FIG. 3(b)  MODE SYNCHRONOUS LIGHT INTENSITY MODULATOR 3
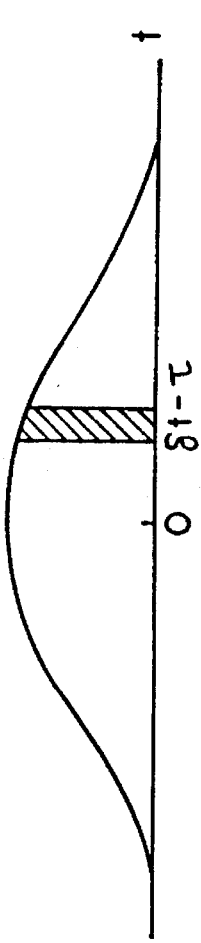
FIG. 3(c)  MODE SYNCHRONOUS LIGHT INTENSITY MODULATOR 4

LASER DEVICE

BACKGROUND OF THE INVENTION

1. Field of the Invention

The present invention relates to a laser device.

2. Description of the Related Art

Until now, various laser devices, or devices each which amplifies light on induced emission and generates in a resonator, have been developed. Laser devices are classified into gas lasers, solid state lasers, and semiconductor lasers by the light gain medium in use. Furthermore, laser devices are classified into lasers with the Fabry-Perot resonators and lasers with the ring resonators by the resonator type in use.

The Fabry-Perot resonator is a resonant cavity of type in which light is resonated by two end mirrors separately faced. The ring resonator is a resonant cavity formed of a ring light propagation path.

In the general laser devices, the oscillation frequency (oscillation wavelength) is determined by the configuration of the resonator and the characteristics of the gain medium. In order to vary the oscillation wavelength, a wave selection element such as a diffraction grating or a thin-film filter arranged on a single resonator forming reflection mirror as well as a drive system for rotating the selection element are prepared to vary the angle of incident light.

However, in such a configuration which including the drive system that rotates the diffraction grating forming a resonator to control the oscillation wavelength, the diffraction grating rotating drive system requires a high accuracy. Consequently, there are disadvantages in that the device manufacturing cost is high and the mechanical drive system has a slow response characteristic.

SUMMARY OF THE INVENTION

The present invention is made to overcome the above mentioned problems. An object of the present invention is to provide a laser device that has its simplified structure and also can suppress the device manufacturing cost and control the oscillation wavelength.

In order to achieve the above objects, according to the present invention, the laser device is characterized by a laser resonator formed of a positive dispersion region, a negative dispersion region, the first and second dispersion regions having the same dispersion amount, a first mode synchronous light modulator, a second mode synchronous light modulator, and a light gain medium; a light propagation path formed by arranging in the light propagating order the first mode synchronous light modulator, the positive dispersion region, the second mode synchronous light modulator, and the negative dispersion region; the light gain medium being arranged in any place in the light propagation path; and control means for varying a mutual phase in modulation between the first mode synchronous light modulator and the second mode synchronous light modulator.

According to the present invention, the light gain medium is arranged at a place with an intermediate light dispersion amount in the positive dispersion region. The light gain medium is arranged at a place with an intermediate light dispersion amount in the negative dispersion region.

Furthermore, according to the present invention, a light isolator regulates light propagation direction. The ends of the positive dispersion region are connected jointlessly to the ends of the negative dispersion region, the positive dispersion region and the negative dispersion region having the same dispersion amount.

According to the present invention, each of the first mode synchronous light modulator and the second mode synchronous light modulator has a modulation frequency integer times a basic frequency.

Furthermore, according to the present invention, the control means modulates the first mode synchronous light modulator and the second mode synchronous light modulator at the same frequency and varies the relative phase.

According to the present invention, the first mode synchronous light modulator and the second mode synchronous light modulator are formed as a light intensity modulator. The first mode synchronous light modulator and the second mode synchronous light modulator are formed as a light phase modulator.

Moreover, the light gain medium is formed of a semiconductor material.

As described above, the laser device includes a laser resonator formed of a positive dispersion region, a negative dispersion region, the first and second dispersion regions having the same dispersion amount, a first mode synchronous light modulator, a second mode synchronous light modulator, and a light gain medium; a light propagation path formed by arranging in the light propagating order the first mode synchronous light modulator, the positive dispersion region, the second mode synchronous light modulator, and the negative dispersion region; the light gain medium being arranged in any place in the light propagation path; and control means for varying a mutual phase in modulation between the first mode synchronous light modulator and the second mode synchronous light modulator. Hence, a laser beam with a desired wavelength can be controlled.

According to the present invention, the light gain medium is arranged at a place with an intermediate light dispersion amount in the positive dispersion region, and the light gain medium is arranged at a place with an intermediate light dispersion amount in the negative dispersion region. Hence a laser beam with a desired wavelength can be effectively oscillated.

Furthermore, according to the present invention, since a light isolator regulates light propagation direction, and the ends of the positive dispersion region are connected jointlessly to the ends of the negative dispersion region, the positive dispersion region and the negative dispersion region having the same dispersion amount, a laser beam with a desired wavelength can be effectively oscillated.

According to the present invention, since each of the first mode synchronous light modulator and the second mode synchronous light modulator has a modulation frequency integer times a basic frequency, a laser beam with a desired wavelength can be effectively oscillated.

According to the present invention, the control means modulates the first mode synchronous light modulator and the second mode synchronous light modulator at the same frequency and varies the relative phase. Hence a laser beam can be emitted.

According to the present invention, the first mode synchronous light modulator and the second mode synchronous light modulator are formed as a light intensity modulator. The first mode synchronous light modulator and the second mode synchronous light modulator are formed as a light phase modulator. Hence a laser beam can be emitted.

Moreover, according to the present invention, since the light gain medium is formed of a semiconductor material, a laser beam can be emitted.

Consequently, the laser device according to the present invention has the simple configuration that includes the positive dispersion region, the negative dispersion region, the first mode synchronous light intensity modulator, the second mode synchronous light intensity modulator, the light gain medium, and the control means. There are advantages in that light beam with a desired wavelength can be oscillated, with the device forming cost suppressed, and the oscillation wavelength can be varied.

According to the present invention, there is an advantage in that the oscillation wavelength can be effectively controlled by varying the relative phase of the modulation to the first and the second light modulators.

Moreover, according to the present invention, there is an advantage in that the relative phase in modulation can be easily adjusted by setting the modulation frequency of each light intensity modulator for mode synchronization to a frequency integer times a basic frequency.

Furthermore, according to the present invention, there is an advantage in that since each light intensity modulator for mode synchronization is modulated at the same frequency and is formed so as to vary the relative phase, the relative phase in modulation can be easily adjusted.

BRIEF DESCRIPTION OF THE DRAWINGS

FIGS. 3(a) to 3(c) are block diagrams each used for explaining the operation of a laser device according to an embodiment of the present invention.

DESCRIPTION OF THE PREFERRED EMBODIMENTS

The embodiments of the present invention will be described below with reference to the attached drawings.

(a) An embodiment of the invention

Figure 1:
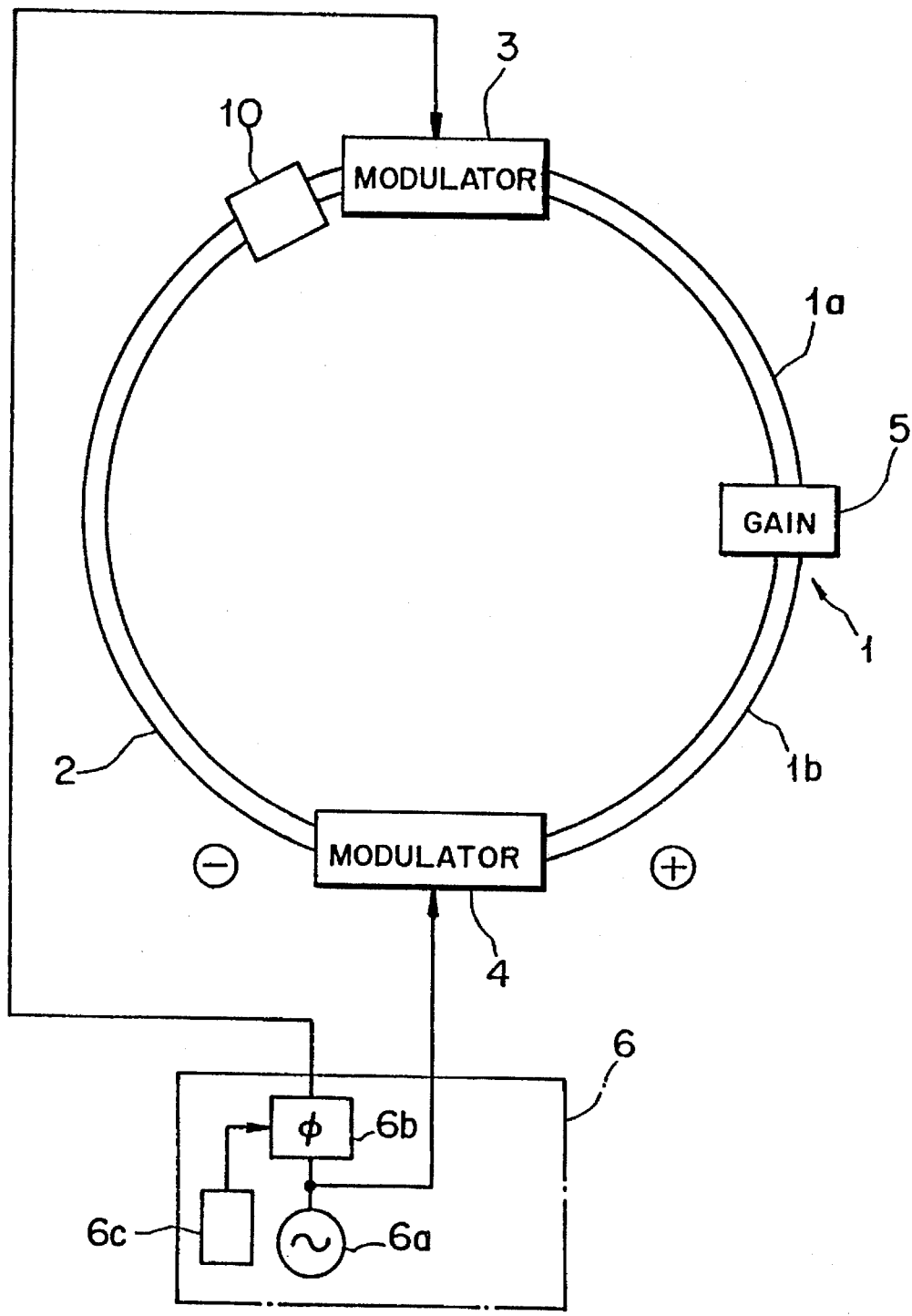
FIG. 1 is a block diagram showing a laser device according to an embodiment of the present invention.

FIG. 1 is a block diagram showing a laser device according to an embodiment of the present invention. Referring to FIG. 1, numeral 1 represents a medium of a positive dispersion region (hereinafter, merely referred to as the positive dispersion region 1), and 2 represents a medium of a negative dispersion region having the same dispersion amount as that of the positive dispersion region 1 and a sign opposite to that of the positive dispersion region 1 (hereinafter, merely referred to as the negative dispersion region 2). The positive dispersion region 1 and the negative dispersion region 2 are formed of, for example, an optical fiber.

In concrete, the positive dispersion region 1 is formed of an optical fiber which has a positive dispersion value (e.g. approximate 20 ps/nm) at the center of the variable wavelength and is positive all over the variable wavelengths. The negative dispersion region 2 is formed of, for example, an optical fiber in which the absolute dispersion value is equal to that of the optical fiber forming the positive dispersion region 1 all over the variable wavelengths and the sign is negative.

Moreover, the first mode synchronous light intensity modulator (first mode synchronous light modulator) 3 is arranged on one boundary portion between the positive dispersion region 1 and the negative dispersion region 2. The second mode synchronous light intensity modulator (second mode synchronous light modulator) 4 is arranged on the other boundary portion between the positive dispersion region 1 and the negative dispersion region 2.

Figure 2:
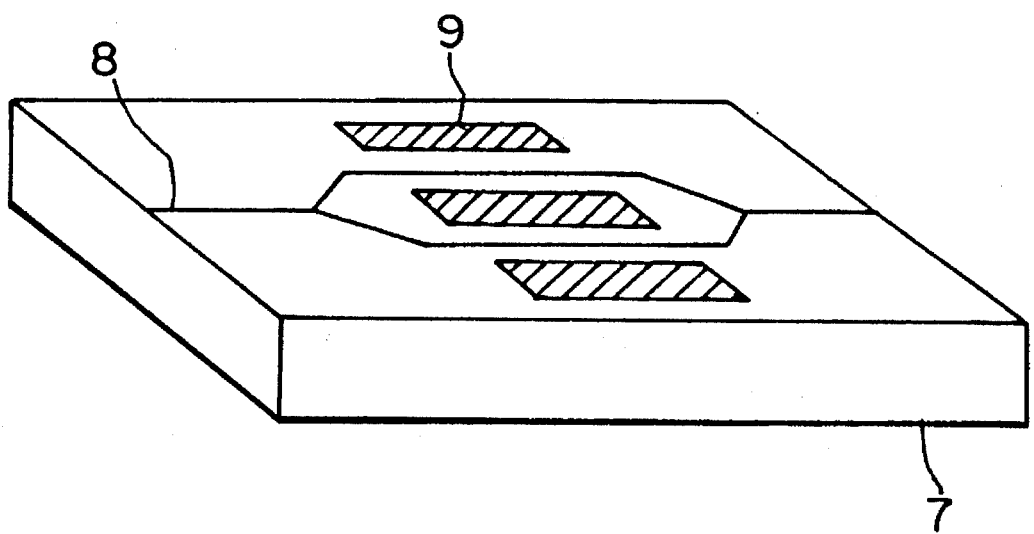
FIG. 2 is a schematic perspective diagram showing the configuration of a mode synchronous light intensity modulator according to an embodiment of the present invention.

The MZ-type light intensity modulator, shown in FIG. 2, including the waveguide 8 and the electrodes 9 formed on the LiNbO3 (lithium niobate) substrate 7 can be used as the first and second mode synchronous light intensity modulators 3 and 4. It is desirable to use the mode synchronous light intensity modulators 3 and 4 in which the light phase does not vary due to modulation.

Numeral 5 represents a light gain medium. The light gain medium 5 is arranged in the middle portion of the degree of dispersion of the positive dispersion region 1. The light gain medium 5, which is formed, for example, of a semiconductor material, is coated with an anti-reflection interference film for nonreflecting effect. Thus a semiconductor laser is realized in this embodiment.

In other words, there are arranged in the light propagating order the first mode synchronous light intensity modulator 3, the positive dispersion region 1a with a predetermined dispersion amount (first positive dispersion region), the light gain medium 5, the positive dispersion region 1b with the same dispersion amount as that of the positive dispersion region 1a (second positive dispersion region), the second mode synchronous light intensity modulator 4, and the negative dispersion region 2 with a dispersion amount twice the dispersion amount of each of the positive dispersion regions 1a and 1b. In such a structure, the wavelength dispersion amount can be nearly zeroed by closing the system from the first mode synchronous light intensity modulator 3 to the first mode synchronous light intensity modulator 3 via the positive dispersion region 1a, the positive dispersion region 1b, the light intensity modulator 4, and the negative dispersion region 2.

Hence, the first mode synchronous light intensity modulator 3 is arranged between one end of the first positive dispersion region 1a and one end of the negative dispersion region 2. The second mode synchronous light intensity modulator 4 is arranged between the other end of the second positive dispersion region 1b and the other end of the negative dispersion region 2. The light gain medium is arranged between the other end of the first positive dispersion region 1a and one end of the second positive dispersion region.

A ring laser resonator is formed by connecting sequentially and jointlessly the ends each of the first positive dispersion region 1a, the second positive dispersion region 1b, and the negative dispersion region 2.

In order to connect seamlessly the ends of each of the optical fibers 1a, 1b, and 2, the end of the fiber is slantingly cut, then positioned, and finally jointed with an optical bonding substance with an aligned refractive index.

Numeral 10 represents an optical isolator. The optical isolator 10 regulates the propagation of light to a fixed direction. The optical isolator 10 can be inserted into any portion in the optical fibers 1a, 1b, and 2 (in this case, arranged in the optical fiber 2).

Numeral 6 represents a control unit (control means). The control unit 6 modulates the first mode synchronous light intensity modulator 3 and the second mode synchronous light intensity modulator 4 at the same frequency and varies the relative phase. The control unit 6 is formed of a sine wave signal output unit 6a which outputs sine wave signals, a phase adjuster 6b, and a phase amount setting unit 6c which sets the phase amount of the phase adjuster 6b.

In the laser device with the above-mentioned structure according to the present invention, the wavelength dispersion amount of laser beams is nearly zeroed in one circulation. Since one cycle time can be fixed to a constant value, the modulation frequency can be fixed to a constant value without depending on the wavelength of the light.

As to the laser with the above-mentioned structure, let us explain with reference to FIG. 3 that light loss is minimized at the time of no variations in wavelength so that an oscillation wavelength is obtained.

If the light waveform within the laser resonator is a pulse form or intensity modulated light form, the light wave length at the peak time in the light gain medium 5 is determined on the basis of the peak time so as to pass through the one mode synchronous light intensity modulator at the peak time of the transmittance and the other mode synchronous light intensity modulator at the peak time of the transmittance.

The light with the same wave length which passes through the light gain medium 5 at a time shifted by $\delta t$ from the peak time passes through the first mode synchronous light intensity modulator 3 and the second mode synchronous light intensity modulator 4 at a time shifted by $\delta t$ from the transmittance peak time. Because the shift of wavelength causes different arrival time to the mode synchronous light intensity modulators 3 and 4, the laser beam with a different wavelength which passes through the light gain medium 5 at a time shifted by $\delta t$ from the peak time (refer to FIG. 3(a)) passes through one mode synchronous light intensity modulator (e.g. numeral 3) at a time shifted by $(\delta t + \tau)$ from the transmittance peak time (refer to FIG. 3(b)), and through the other mode synchronous light intensity modulator (e.g. numeral 4) at a time shifted by $(\delta t - \tau)$ from the transmittance peak time (refer to FIG. 3(c)).

In an example, it is assumed that the amplitude transmittance of the mode synchronous light intensity modulator is cos (t), and the time at which light emitted from the light gain medium 5 at a peak time reaches the mode synchronous light intensity modulator is t=0. The total transmittance of the two mode synchronous light intensity modulators 3 and 4 is expressed by the following formula (1):

$$cos(\delta t+\tau) \bullet cos(\delta t-\tau) = (\frac{1}{2})[cos(2\delta t) + cos(2\tau)] \quad (1)$$

Hence, the total transmittance of the two mode synchronous light intensity modulators 3 and 4 is maximized at ($\tau$=0) for each $\delta t$. In this case, light exists in only the range of $(\delta t+\tau)<(\pi/2)$ or $(\delta t-\tau)<(\pi/2)$.

In another example, where the amplitude transmittance of the mode synchronous light intensity modulator has a Gaussian form ($exp(-t^2)$) during a period of interest, the total transmittance of the two mode synchronous light intensity modulators 3 and 4 is expressed as the following formula (2):

$$exp[-(\delta t+\tau)^2] \bullet exp[-(\delta t-\tau)^2] = exp[-2\delta t^2 - 2\tau^2] \quad (2)$$

Hence, the transmittance becomes the maximum at ($\tau$=0) for each $\tau t$.

In the laser device with the above-mentioned structure, the light loss is minimized when the wavelength fluctuation in time is zero. Even when the above-mentioned laser device is used, the range of the gain wavelength band determines the oscillation wavelength.

Moreover, in the above-mentioned laser device, the phase amount setting unit 6c operates the phase adjuster 6b, with fluctuation in wavelength eliminated, to vary the relative phase of the modulation signal supplied to the mode synchronous light intensity modulators 3 and 4. Thus the oscillation can be established at a different wavelength while the mode synchronization is maintained.

As described above, the laser device according to the present embodiment can vary the oscillation wavelength over a wavelength band ranging, for example, from 1.52 μm to 1.56 μm.

If the dispersion amount is about 20 ps/nm and the drive frequency of each of the mode synchronous light intensity modulators 3 and 4 is about 1 GHz, the period becomes about 1000 ps. In other words, the shift in time is ±250 ps by shifting the relative phase between the two mode synchronous light intensity modulators 3 and 4 by ($\pm\pi/2$). Hence, in order to establish the time difference of ±250 ps at a dispersion of 20 ps/nm, the shift in wavelength is ±12.5 nm (=±0.00125 μm).

As described above, according to the embodiment of the present invention, the laser device consists of the positive dispersion region 1, the negative dispersion region 2, the first mode synchronous light intensity modulator 3, the second mode synchronous light intensity modulator 4, the light gain medium 5, and the control unit 6. There is an advantage in that the simplified structure can suppress the device manufacturing cost and further control the oscillation wavelength.

(a1) A modified example of an embodiment of the present invention

Figure 4:
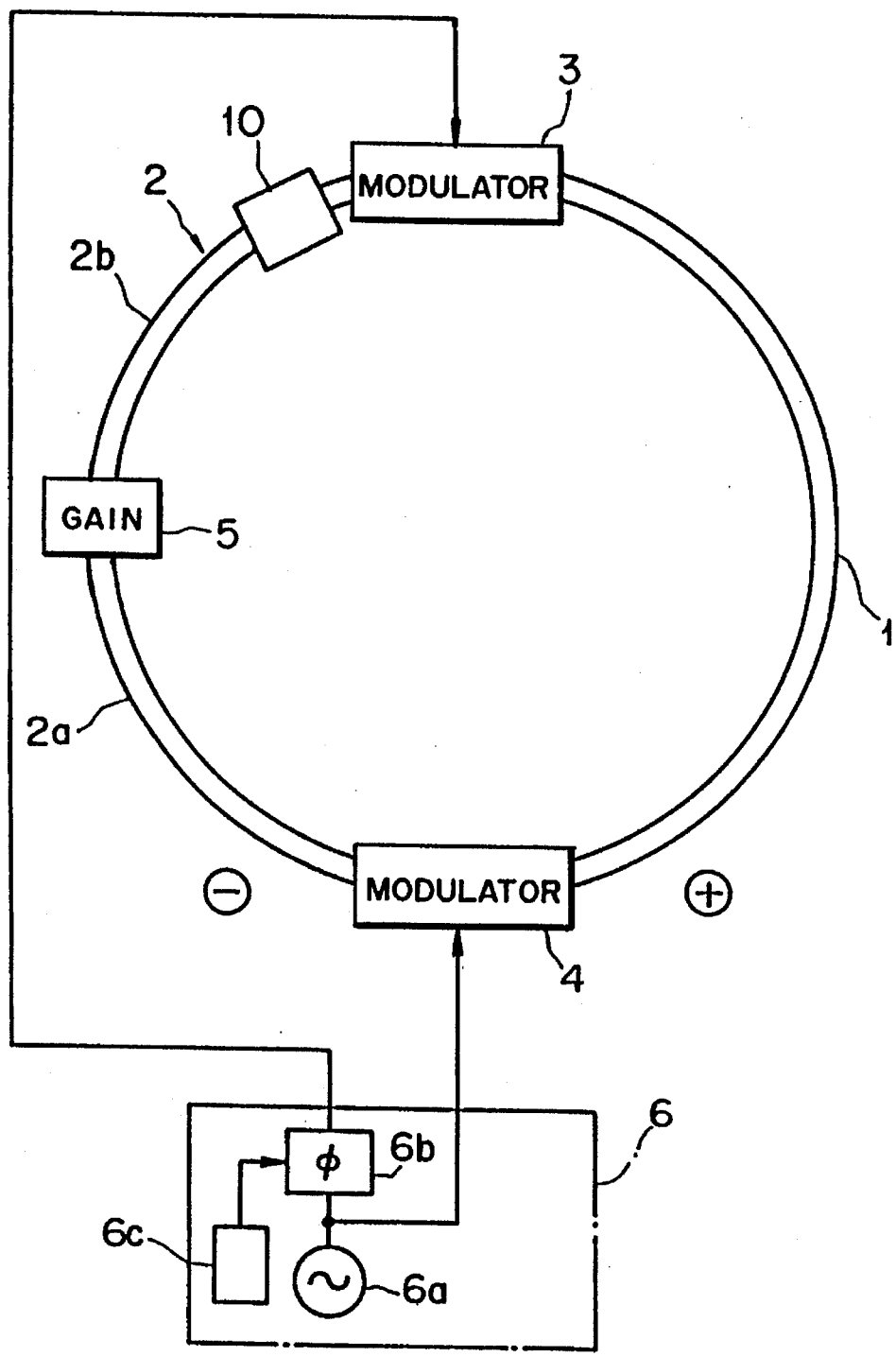
FIG. 4 is a block diagram showing a laser device according to an embodiment of the present invention.

In the above-mentioned laser device according to the embodiment of the present invention, the light gain medium of a semiconductor material is inserted into the positive dispersion region 1 or arranged between the other end of the first positive dispersion region 1a and one end of the second positive dispersion region 1b. However, the insertion place should not be limited only to the embodiment. The light gain medium of a semiconductor material, as shown in FIG. 4, may be inserted into the negative dispersion region 2 arranged between the other end of the first negative dispersion region 2a and one end of the second negative dispersion region 2b.

In such a case, the laser device includes a laser resonator which is formed of the first negative dispersion region 2a with a predetermined dispersion amount, the second negative dispersion region 2b with the same dispersion amount as that of the first negative dispersion region 2a, and the positive dispersion region 1 with a dispersion amount twice the dispersion amount of each of the negative dispersion regions. The first mode synchronous light modulator 3 is arranged between one end of the first negative dispersion region 2a and one end of the positive dispersion region 1. The second mode synchronous light modulator 4 is arranged between the other end of the second negative dispersion region 2b and the other end of the positive dispersion region 1. The light gain medium 5 of a semiconductor material is arranged between the other end of the first negative dispersion region 2a and one end of the second negative dispersion region 2b.

Hence, the above-mentioned structure can provide the same effect and advantage as those in the embodiment.

(b) Others

The above-mentioned embodiment includes the first mode synchronous light intensity modulator 3 and the second mode synchronous light intensity modulator 4. However, the present invention should not be limited only to the above-mentioned embodiment. Light phase modulators can be substituted for the first and second mode synchronous light intensity modulators 3 and 4, respectively.

In the above-mentioned embodiment, a semiconductor material is used for the formation of the light gain medium 5. However, an optical fiber made of, for example, erbium with a long gain relaxation time can be used as the light gain medium 5, without being limited to the above-mentioned example. In this case, even if the optical fiber is not arranged at the place with the middle value of the dispersion amount of the positive dispersion region or negative dispersion region, like the semiconductor light gain medium 5, pulse light can be emitted as if a semiconductor material with a short relaxation time emits.

Furthermore, in the above-mentioned embodiment, the control unit 6 modulates the first mode synchronous light intensity modulator 3 and the second mode synchronous light intensity modulator 4 at the same frequency to vary the relative phase. However the present invention should not be limited only to the embodiment. For example, the first mode synchronous light intensity modulator 3 and the second mode synchronous light intensity modulator 4 can be modulated at a frequency an integer times the basic frequency to vary the relative phase.

Moreover, it is unnecessary that the light modulator produces always modulated signals with cosine waveforms, but it may produces signals with Gaussian waveforms or mode synchronization enabling waveforms.

What is claimed is:

1. A laser device comprising:

a laser resonator formed of a positive dispersion region, a negative dispersion region, said first and second dispersion regions having the same dispersion amount, a first mode synchronous light modulator, a second mode synchronous light modulator, and a light gain medium;

a light propagation path formed by arranging in the light propagating order said first mode synchronous light modulator, said positive dispersion region, said second mode synchronous light modulator, and said negative dispersion region; said light gain medium being arranged in any place in said light propagation path; and control means for varying a mutual phase in modulation between said first mode synchronous light modulator and said second mode synchronous light modulator.

2. The laser device according to claim 1, wherein said light gain medium is arranged at a place with an intermediate light dispersion amount in said positive dispersion region.

3. The laser device according to claim 1, wherein said light gain medium is arranged at a place with an intermediate light dispersion amount in said negative dispersion region.

4. The laser device according to claim 1, further comprising a light isolator for regulating light propagation direction; and wherein the ends of said positive dispersion region are connected jointlessly to the ends of said negative dispersion region, said positive dispersion region and said negative dispersion region having the same dispersion amount.

5. The laser device according to claim 1, wherein each of said first mode synchronous light modulator and said second mode synchronous light modulator has a modulation frequency integer times a basic frequency.

6. The laser device according to claim 1, wherein said control means modulates said first mode synchronous light modulator and said second mode synchronous light modulator at the same frequency and varies the relative phase.

7. The laser device according to claim 1, wherein said first mode synchronous light modulator and said second mode synchronous light modulator are formed as a light intensity modulator.

8. The laser device according to claim 1, wherein said first mode synchronous light modulator and said second mode synchronous light modulator are formed as a light phase modulator.

9. The laser device according to claim 1, wherein said light gain medium is formed of a semiconductor material.

* * * * *